(12) United States Patent
Kimoto

(10) Patent No.: US 11,515,446 B2
(45) Date of Patent: Nov. 29, 2022

(54) ELEMENT, ELECTRONIC DEVICE, AND METHOD FOR PRODUCING ELEMENT

(71) Applicant: SHARP KABUSHIKI KAISHA, Osaka (JP)

(72) Inventor: Kenji Kimoto, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 107 days.

(21) Appl. No.: 16/978,017

(22) PCT Filed: Mar. 8, 2018

(86) PCT No.: PCT/JP2018/009077
§ 371 (c)(1),
(2) Date: Sep. 3, 2020

(87) PCT Pub. No.: WO2019/171556
PCT Pub. Date: Sep. 12, 2019

(65) Prior Publication Data
US 2020/0411719 A1    Dec. 31, 2020

(51) Int. Cl.
*H01L 33/06* (2010.01)
*H01L 31/0352* (2006.01)

(52) U.S. Cl.
CPC ...... *H01L 33/06* (2013.01); *H01L 31/035218* (2013.01)

(58) Field of Classification Search
CPC .. H01L 33/06; H01L 31/035218; H01L 33/50
USPC .......................................................... 257/13
See application file for complete search history.

(56) References Cited

U.S. PATENT DOCUMENTS

| | | | |
|---|---|---|---|
| 9,768,404 B1* | 9/2017 | Steckel | H01L 51/5096 |
| 10,158,054 B1* | 12/2018 | Lin | H01L 33/56 |
| 2002/0093283 A1 | 7/2002 | Seo et al. | |
| 2005/0170737 A1 | 8/2005 | Seo et al. | |
| 2012/0138894 A1 | 6/2012 | Qian et al. | |
| 2012/0174969 A1 | 7/2012 | Murayama | |
| 2015/0010130 A1* | 1/2015 | Nakatsugawa | C09K 11/7771 250/361 C |
| 2015/0315460 A1 | 11/2015 | Gim et al. | |
| 2017/0205664 A1* | 7/2017 | Cho | G02F 1/133528 |
| 2017/0213924 A1* | 7/2017 | Kubo | C01B 19/007 |
| 2020/0313047 A1* | 10/2020 | Yamada | H01L 33/507 |
| 2021/0135139 A1* | 5/2021 | Lee | H01L 51/502 |

FOREIGN PATENT DOCUMENTS

| | | |
|---|---|---|
| JP | 2005235783 A | 9/2005 |
| JP | 2007042314 A | 2/2007 |
| JP | 2012-533156 A | 12/2012 |
| JP | 2016505661 A | 2/2016 |
| WO | 2011/037042 A1 | 3/2011 |
| WO | 2012/161179 A1 | 11/2012 |

* cited by examiner

*Primary Examiner* — David Vu
*Assistant Examiner* — Brandon C Fox
(74) *Attorney, Agent, or Firm* — ScienBiziP, P.C.

(57) ABSTRACT

An element includes an electron transportation layer containing nanoparticles, a QD layer containing QD phosphor particles, and a mixed layer sandwiched between the electron transportation layer and the QD layer to be adjacent to these layers. The mixed layer contains QD phosphor particles and nanoparticles.

20 Claims, 8 Drawing Sheets

| | LOWER LAYER (FIRST LAYER) | UPPER LAYER (SECOND LAYER) | LOWER LAYER (FIRST LAYER) | | UPPER LAYER (SECOND LAYER) | | MIXED LAYER (THIRD LAYER) |
|---|---|---|---|---|---|---|---|
| | | | D1 (CENTRAL VALUE OF PARTICLE SIZE) | d1 (FILM THICKNESS) | D2 (CENTRAL VALUE OF PARTICLE SIZE) | d2 (FILM THICKNESS) | d3 (FILM THICKNESS) |
| EXAMPLE 1 | QDL (SMALLER PARTICLE SIZE) | ETL (LARGER PARTICLE SIZE) | 8 nm (4 TO 16 nm) | 40 nm (8 TO 80 nm) | 16 nm (8 TO 60 nm) | 80 nm (40 TO 160 nm) | 40 nm (IN CASE OF TYPICAL EXAMPLE OF LEFT EXAMPLE: 32 TO 80 nm) |
| EXAMPLE 2 | ETL (LARGER PARTICLE SIZE) | QDL (SMALLER PARTICLE SIZE) | 16 nm (8 TO 60 nm) | 80 nm (40 TO 160 nm) | 8 nm (4 TO 16 nm) | 40 nm (8 TO 80 nm) | 40 nm (IN CASE OF TYPICAL EXAMPLE OF LEFT EXAMPLE: 32 TO 80 nm) |
| EXAMPLE 3 | QDL (SMALLER PARTICLE SIZE) | ETL (LARGER PARTICLE SIZE) | 8 nm (4 TO 16 nm) | 40 nm (8 TO 80 nm) | 3 nm (1 TO 13 nm) | 80 nm (40 TO 160 nm) | 30 nm (IN CASE OF TYPICAL EXAMPLE OF LEFT EXAMPLE: 16 TO 80 nm) |
| EXAMPLE 4 | ETL (LARGER PARTICLE SIZE) | QDL (SMALLER PARTICLE SIZE) | 3 nm (1 TO 13 nm) | 80 nm (40 TO 160 nm) | 8 nm (4 TO 16 nm) | 40 nm (8 TO 80 nm) | 30 nm (IN CASE OF TYPICAL EXAMPLE OF LEFT EXAMPLE: 16 TO 80 nm) |
| EXAMPLE 5 | QDL (SMALLER PARTICLE SIZE) | HTL (LARGER PARTICLE SIZE) | 8 nm (4 TO 16 nm) | 40 nm (8 TO 80 nm) | 16 nm (8 TO 60 nm) | 80 nm (40 TO 160 nm) | 40 nm (IN CASE OF TYPICAL EXAMPLE OF LEFT EXAMPLE: 32 TO 80 nm) |
| EXAMPLE 6 | HTL (LARGER PARTICLE SIZE) | QDL (SMALLER PARTICLE SIZE) | 16 nm (8 TO 60 nm) | 80 nm (40 TO 160 nm) | 8 nm (4 TO 16 nm) | 40 nm (8 TO 80 nm) | 40 nm (IN CASE OF TYPICAL EXAMPLE OF LEFT EXAMPLE: 32 TO 80 nm) |
| EXAMPLE 7 | QDL (LARGER PARTICLE SIZE) | HTL (SMALLER PARTICLE SIZE) | 8 nm (4 TO 16 nm) | 40 nm (8 TO 80 nm) | 3 nm (1 TO 13 nm) | 80 nm (40 TO 160 nm) | 30 nm (IN CASE OF TYPICAL EXAMPLE OF LEFT EXAMPLE: 16 TO 80 nm) |
| EXAMPLE 8 | HTL (SMALLER PARTICLE SIZE) | QDL (LARGER PARTICLE SIZE) | 3 nm (1 TO 13 nm) | 80 nm (40 TO 160 nm) | 8 nm (4 TO 16 nm) | 40 nm (8 TO 80 nm) | 30 nm (IN CASE OF TYPICAL EXAMPLE OF LEFT EXAMPLE: 16 TO 80 nm) |

FIG. 7

| NANOPARTICLES | | LIGAND | | | |
|---|---|---|---|---|---|
| | | WHEN DISPERSED IN NON-POLAR SOLVENT | | WHEN DISPERSED IN POLAR SOLVENT | |
| LAYER | MATERIAL | TYPE | SPECIFIC EXAMPLE | TYPE | SPECIFIC EXAMPLE |
| QDL | · CdSe/CdS<br>· CdSe/ZnS<br>· InP/ZnS<br>· CIGS/ZnS<br>ETC. | · R-SH<br>· R-NH$_2$<br>· ORGANIC PHOSPHORUS COMPOUND<br>ETC. | · DODECANETHIOL<br>· HEXADECYLAMINE<br>· OLEYLAMINE<br>· TRIOCTYLPHOSPHINE<br>· TRIOCTYLPHOSPHINE OXIDE<br>ETC. | · A$_1$-R$_1$-B$_1$<br>ETC. | · 12-AMINODODECANOIC ACID<br>· 12-AMINO-1-DODECANETHIOL<br>· 12-MERCAPTODODECANOIC ACID<br>ETC. |
| HTL | · NiO<br>· Cr$_2$O$_3$<br>· Cu$_2$O<br>· CuO<br>· CuAlO$_2$<br>ETC. | · R-COOH<br>· R-NH$_2$<br>ETC. | · PALMITIC ACID<br>· OLEIC ACID<br>· HEXADECYLAMINE,<br>OLEYLAMINE<br>ETC. | · NONE<br>OR<br>· A$_2$-R$_2$-B$_2$<br>ETC. | · NONE<br>OR<br>· ETHANOLAMINE<br>· 3-AMINOPROPANOIC ACID<br>· GLYCOLIC ACID<br>ETC. |
| ETL | · ZnO<br>· TiO$_2$<br>· Ta$_2$O$_3$<br>· SrTiO$_3$<br>ETC. | · R-COOH<br>· R-NH$_2$<br>ETC. | · PALMITIC ACID<br>· OLEIC ACID<br>· HEXADECYLAMINE,<br>OLEYLAMINE<br>ETC. | · NONE<br>OR<br>· A$_2$-R$_2$-B$_2$<br>ETC. | · NONE<br>OR<br>· ETHANOLAMINE<br>· 3-AMINOPROPANOIC ACID<br>· GLYCOLIC ACID<br>ETC. |

FIG. 8

ELEMENT, ELECTRONIC DEVICE, AND METHOD FOR PRODUCING ELEMENT

TECHNICAL FIELD

One aspect of the disclosure relates to an element containing quantum dot (QD) phosphor particles.

BACKGROUND ART

In recent years, elements containing QD phosphor particles (also referred to as semiconductor nanoparticle phosphors) (more specifically, photoelectric conversion elements) have been used. PTL 1 discloses a light-emitting element that is an example of these elements. The light-emitting element of PTL 1 includes (i) a layer containing QD phosphor particles (a light-emitting layer), and (ii) a layer containing inorganic nanoparticles (an electron injection/transport layer or a hole injection/transport layer).

CITATION LIST

Patent Literature

PTL 1: JP-T-2012-533156

SUMMARY

Technical Problem

An aspect of the disclosure aims to improve the performance of elements compared with before.

Solution to Problem

In order to solve the above-described problems, an element according to an aspect of the disclosure includes a first layer containing first nanoparticles, a second layer containing second nanoparticles that are nanoparticles of a different type from the first nanoparticles, and a third layer sandwiched between the first layer and the second layer, in which one of the first nanoparticles and the second nanoparticles is quantum dot phosphor particles, and the third layer contains the first nanoparticles and the second nanoparticles.

Advantageous Effects of Disclosure

According to the element according to an aspect of the disclosure, the performance can be improved compared with before.

BRIEF DESCRIPTION OF DRAWINGS

FIG. 7 is a diagram illustrating a configuration of each of Examples 1 to 8 in a fourth embodiment.

FIG. 8 is a diagram illustrating examples of ligands that are suitable for materials of nanoparticles of each layer in a fifth embodiment.

DESCRIPTION OF EMBODIMENTS

First Embodiment

Figure 1:
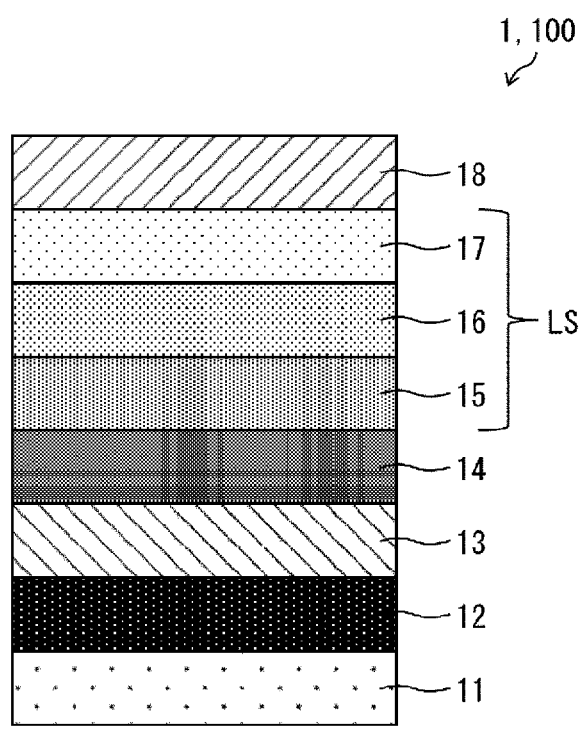
FIG. 1 is a diagram illustrating a schematic configuration of an element according to a first embodiment.

FIG. 1 illustrates a schematic configuration of an element 1 (photoelectric conversion element) according to a first embodiment. An electronic device with the element 1 will be referred to as an electronic device 100. In the first embodiment, a case in which the element 1 is a light-emitting element will be primarily exemplified. The element 1 as a light-emitting element may be used as a light source for the electronic device 100 (e.g., a display device).

Among members included in the element 1, members that are not relevant to the first embodiment will be omitted. It should be understood that the members of which description is omitted are similar to those known in the related art. Further, it should be noted that the drawings schematically show the shapes, structures, and positional relationships with respect to respective members, and are not necessarily drawn to scale.

Configuration of Element 1

In the element 1, a QD layer 15 (quantum dot phosphor layer or first layer) is provided between a first electrode 12 and a second electrode 18. In the first embodiment, the first electrode 12 is an anode electrode (anode) and the second electrode 18 is a cathode electrode (cathode). In the present specification, the direction from a substrate 11, which will be described below, toward the first electrode 12 (or the second electrode 18) will be referred to as "upward direction." In addition, the direction opposite to upward direction will be referred to as "downward direction."

The QD layer 15 contains QD phosphor particles 150 (quantum dot phosphor particles or first nanoparticles) (see FIG. 2 below). The QD phosphor particles 150 emit light according to a recombination of holes supplied from the first electrode 12 (anode electrode) with electrons supplied from the second electrode 18 (cathode electrode). The QD layer 15 of the first embodiment functions as a light-emitting layer.

The element 1 includes, upward from a substrate 11 of FIG. 1, the first electrode 12, a hole injection layer (HIL) 13, a hole transportation layer (HTL) 14, the QD layer 15, a mixed layer 16 (third layer), an electron transportation layer (ETL) 17 (second layer), and the second electrode 18 in this order. The first electrode 12 and the second electrode 18 can each be connected to a power supply (e.g., a direct current power supply), which is not illustrated.

In the first embodiment, a structure composed of the QD layer 15, the mixed layer 16, and the electron transportation layer 17 will be referred to as a layered structure LS. In the layered structure LS, a layer disposed at a position closest to the substrate 11 will be referred to as a first layer (lower layer). In the first embodiment, the QD layer 15 is the first layer. Further, in the layered structure LS, a layer disposed at a position farthest from the substrate 11 will be referred to as a second layer (upper layer). In first embodiment, the electron transportation layer 17 is a second layer. As described above, the first layer is disposed closer to the substrate 11 than the second layer is.

A layer sandwiched between the first layer and the second layer to be adjacent to these layers in the layered structure LS will be referred to as a third layer (intermediate layer). In the first embodiment, the mixed layer 16 is a third layer.

As will be described below, the first layer and the second layer each contain nanoparticles. Hereinafter, nanoparticles contained in the first layer will be referred to as first nanoparticles. In addition, nanoparticles contained in the second layer will be referred to as second nanoparticles. The first nanoparticles and second nanoparticles are different types of nanoparticles.

The substrate 11 supports the first electrode 12 to the second electrode 18. The substrate 11 may be composed of a light-transmissive material (e.g., glass) or may be composed of a light reflective material. The first electrode 12 and the second electrode 18 are each composed of a conductive material. The first electrode 12 is electrically connected to the hole injection layer 13. The second electrode 18 also plays a role of an electron injection layer (EIL) that promotes injection of electrons from the second electrode 18 to the QD layer 15.

The first electrode 12 and the second electrode 18 are conductive electrodes (conductive layers). At least one of the first electrode 12 and the second electrode 18 may be a light-transmissive electrode that transmits light (e.g., light emitted from the QD layer 15). Examples of material of the light-transmissive electrode include, for example, ITO, IZO, ZnO, AZO, and BZO.

One of the first electrode 12 and the second electrode 18 may be a reflective electrode that reflects light. As an example, examples of material of the reflective electrode can include Al, Cu, Au, and Ag. These metallic materials have high reflectivity (light transmittance) for visible light and thus are suitable for reflective electrodes.

By applying a forward voltage between the first electrode 12 (anode electrode) and the second electrode 18 (cathode electrode) (by setting the first electrode 12 to have a potential higher than that of the second electrode 18) using the power supply, (i) electrons can be supplied from the second electrode 18 to the QD layer 15 and (ii) holes can be supplied from the first electrode 12 to the QD layer 15. As a result, the QD layer 15 can generate light according to a recombination of the holes with the electrons. The application of the voltage using the power supply may be controlled by a thin film transistor (TFT), which is not illustrated.

The hole injection layer 13 promotes the injection of the holes from the first electrode 12 to the QD layer 15. Examples of material of the hole injection layer 13 include, for example, PEDOT: PSS, nickel oxide, Li-doped nickel oxide, tungsten oxide, indium tin oxide (ITO), and the like.

The hole transportation layer 14 contains a material having excellent hole transport properties. As materials of the hole transportation layer 14 in the first embodiment, for example, PVK (Poly(N-vinylcarbazole)), α-NPD (N,N'-Di-1-naphthyl-N,N'-diphenylbenzidine), poly-TPD (Poly[N,N'-bis(4-butylphenyl)-N,N'-bis(phenyl)-benzidine], nickel oxide, and the like are used. As will be described below, the hole transportation layer 14 may contain a material having excellent hole transport properties as nanoparticles 140 (see FIG. 6).

A material of the QD phosphor particles 150 in the QD layer 15 is a luminescent material (e.g. inorganic light luminescent material) with a valence band level and a conduction band level. As an example, a particle size of the QD phosphor particles 150 may be approximately 4 nm to 16 nm (see a fourth embodiment which will be described below).

When holes and electrons are injected into the QD phosphor particles 150, excitons in which the holes and the electrons are coupled via a Coulomb interaction are generated. The QD phosphor particles 150 emit light of a predetermined wavelength band along with a recombination of the holes and the electrons such as disappearance of excitons. More specifically, the QD phosphor particles 150 emit light when electrons in the exciton level or the conduction band transit to the valence band. Additionally, the QD phosphor particles 150 may emit light according to a recombination of electrons with holes at an energy level (donor level, acceptor level, or the like) of the band gap. In this way, the QD layer 15 emits light with electro-luminescence (EL) (more specifically, injection type EL). Because the QD phosphor particles 150 have high luminous efficiency (energy conversion efficiency), they are suitable for improving the luminous efficiency of the element 1.

In the first embodiment, the element 1 is used as a light source of the electronic device 100. Thus, the band gap of the QD phosphor particles 150 is preferably set to emit visible light in a predetermined wavelength range with EL.

The QD phosphor particles 150 are preferably particles having poor visible light scattering properties. A material of the QD phosphor particles 150 is, for example, a semiconductor material containing at least two or more types selected from the group consisting of "CdS, CdSe, CdTe, ZnS, ZnSe, ZnTe, InN, InP, InAs, InSb, AlP, AlS, AlAs, AlSb, GaN, GaP, GaAs, GaSb, PbS, PbSe, Si, Ge, MgS, MgSe, and MgTe" and combinations thereof. Alternatively, the QD phosphor particles 150 may be a semiconductor material in which two or more types of these materials are dissolved. Alternatively, for a material (semiconductor material) of the QD phosphor particles 150, "$CuInS_2$, $CuGaS_2$, $CuInSe_2$, $CuGaSe_2$, $AgInS_2$, $AgGaS_2$, $AgInSe_2$, $AgGaSe_2$, and ZnS" or a compound material containing two or more of these materials may be used. Alternatively, the QD phosphor particles 150 may be a semiconductor material in which two or more of the materials are dissolved. More specifically, nano-sized crystals (semiconductor crystals) of the above materials are used as a material of the QD phosphor particles 150.

The QD phosphor particles 150 may be two-component core type, three-component core type, four-component core type, core-shell type, or core-multi-shell type QD phosphor particles. In addition, the QD phosphor particles 150 may also be impurity-doped QD phosphor particles, or QD phosphor particles having a graded composition.

Figure 2:
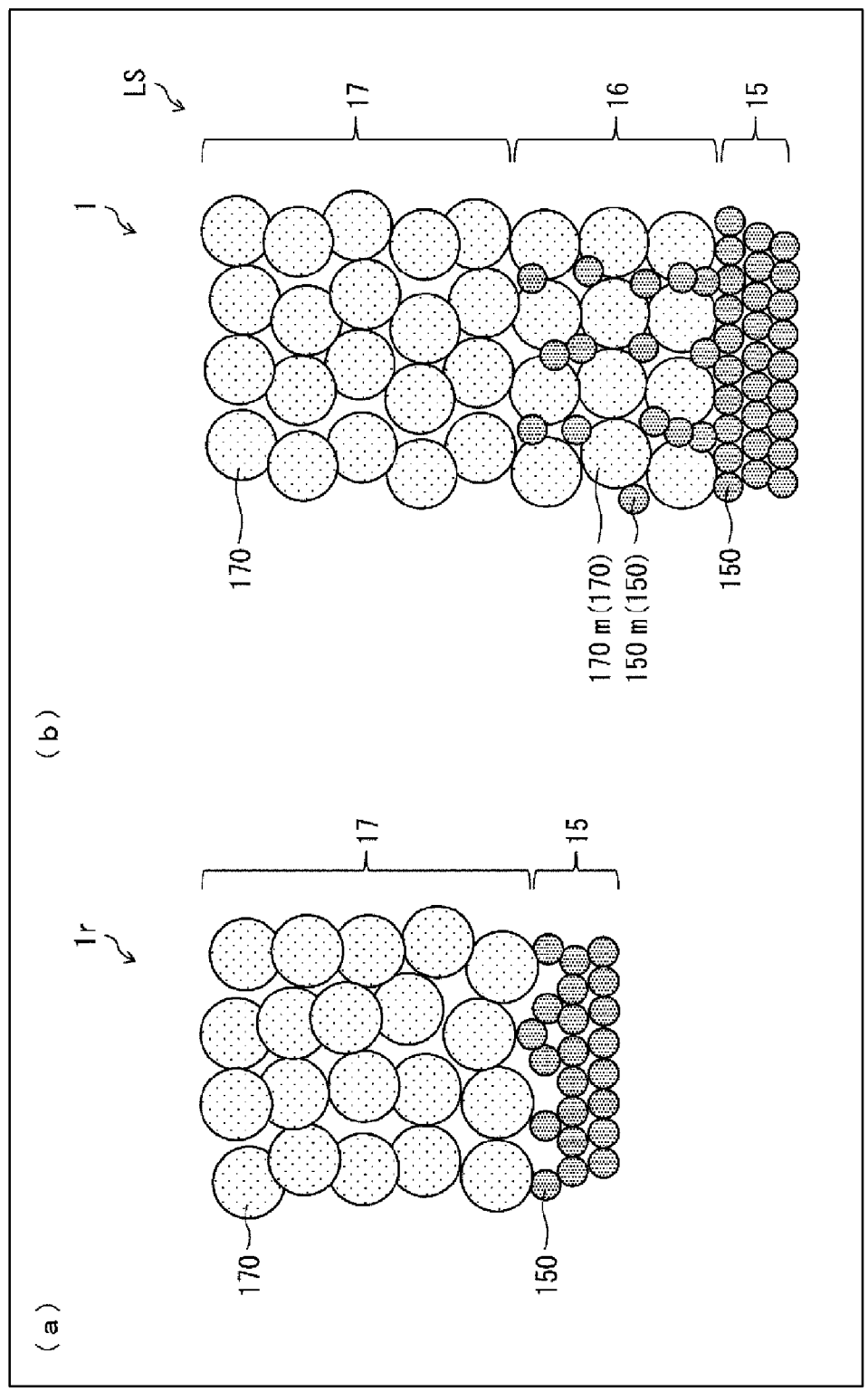
FIGS. 2(a) and 2(b) are diagrams each for describing the role of a mixed layer in the first embodiment.

In FIG. 2 that will be described below, spherical QD phosphor particles 150 (first nanoparticles) are exemplified. However, a shape of the QD phosphor particles 150 is not limited to a spherical shape. For example, a shape of the QD phosphor particles 150 may be a rod shape, a wire shape, a disk-shape, a triangular pyramid shape, or a quadrangular pyramid shape. Any shape known in the art may be applied to the shape of the QD phosphor particles 150. This also applies to the second nanoparticles.

Note that a particle size of the first nanoparticles means a diameter of a circle having the same area as that of the first nanoparticles in a transmissive type microscope image. As an example, if a first nanoparticle is spherical, a particle size of the first nanoparticle means the diameter of the first nanoparticle. The same applies to a particle size of the second nanoparticles.

The electron transportation layer 17 contains a material that has excellent electron transport properties and inhibits (blocks) transport (movement) of holes. The material may be contained in the electron transportation layer 17 as nanoparticles (semiconductor nanoparticles). In the first embodiment, the electron transportation layer 17 contains nanoparticles 170 (second nanoparticles) as the material (see FIG.

2). Examples of material of the nanoparticles 170 include ZnO, $TiO_2$, $Ta_2O_3$, and $SrTiO_3$.

In the present specification, the central value in particle size distribution (median diameter: d50) of the first nanoparticles (e.g., the QD phosphor particles 150) contained in the first layer (e.g., the QD layer 15) is referred to as a first central value D1. Similarly, the central value in particle size distribution (median diameter: d50) of the second nanoparticles (e.g., nanoparticles 170) contained in the second layer (e.g., the electron transportation layer 17) is referred to as a second central value D2.

Of the first central value D1 and the second central value D2, the larger value is referred to as Dm. That is, Dm=Max (D1, D2). As illustrated in FIG. 2, in the first embodiment, a particle size of the QD phosphor particles 150 is smaller than a particle size of the nanoparticles 170. Thus, D1<D2 is satisfied. Therefore, Dm=D2 is satisfied.

However, the particle size of the QD phosphor particles 150 need not necessarily be set to be smaller than the particle size of the nanoparticles 170. The particle size of the QD phosphor particles 150 may be set to be larger than the particle size of the nanoparticles 170 (see a fourth embodiment, which will be described below).

The mixed layer 16 is sandwiched between the QD layer 15 and the electron transportation layer 17 to be adjacent to these layers. The mixed layer 16 comes into contact with the upper face of the QD layer 15 and the lower face of the electron transportation layer 17. As illustrated in FIG. 2, the mixed layer 16 contains two types of nanoparticles that are the QD phosphor particles 150 and the nanoparticles 170.

Comparative Example: Element 1r

FIG. 2 is a diagram for describing a role of the mixed layer 16 (third layer). An element 1r is illustrated in (a) of FIG. 2 as a comparative example of the element 1. The element 1r has a configuration in which the mixed layer 16 is removed from the element 1. Thus, in the element 1r, the upper face of the QD layer 15 comes into contact with the lower face of the electron transportation layer 17.

Voids (first voids) are formed in the QD layer 15 (first layer) among a plurality of QD phosphor particles 150 (first nanoparticles). For that reason, an uneven shape is formed on the upper face of the QD layer 15 due to the plurality of QD phosphor particles 150. In addition, voids (second voids) are formed in the electron transportation layer 17 (second layer) among a plurality of nanoparticles 170 (second nanoparticles). For that reason, an uneven shape is formed on the lower face of the electron transportation layer 17 due to the plurality of nanoparticles 170.

With respect to the configuration of the element 1r, the inventors of the present application (hereinafter, the inventors) have newly found the knowledge that "A particle size of the first nanoparticles is smaller than that the second nanoparticles, so the first voids are smaller than the second voids. For this reason, the second nanoparticles are unlikely to be disposed to fill the first voids near the interface between the first layer and the second layer. Furthermore, the first nanoparticles are less likely to be disposed to fill the second voids near the interface."

Based on the above-described point, the inventors have newly found the knowledge that "The element 1r does not have good contact properties for the first layer and the second layer due to a size difference between the first nanoparticles and the second nanoparticles. In other words, the element 1r does not have good contact properties for a first nanoparticle network (a network consisting of the first nanoparticles) and a second nanoparticle network (a network consisting of the second nanoparticles)."

Further, the inventors have newly found the knowledge that "It is not possible to move the carriers with sufficient efficiency within the element 1r due to the contact properties for the first nanoparticle network and the second nanoparticle network. For this reason, it is not possible for the element 1r to achieve a sufficiently high luminous efficiency (energy conversion efficiency)." The above problems with the element 1r have been newly found by the inventors.

Role of Mixed Layer 16

Based on the above problems with the element 1r, the inventors have conceived a new configuration in which "a layered structure LS is provided in the element 1. In other words, a third layer (e.g., the mixed layer 16) is provided between the first layer and the second layer."

In (b) of FIG. 2, the layered structure LS of the element 1 is illustrated. The mixed layer 16 (i) is adjacent to the first layer (QD layer 15) and the second layer (electron transportation layer 17), and (ii) contains first nanoparticles (QD phosphor particles 150) and second nanoparticles (nanoparticles 170). For convenience of description, the QD phosphor particles 150 contained in the mixed layer 16 are also referred to as QD phosphor particles 150 m (first nanoparticles in the third layer). In addition, the nanoparticles 170 contained in the mixed layer 16 are also referred to as nanoparticles 170 m (second nanoparticles in the third layer).

The third layer contains the nanoparticles 170 m (second nanoparticles in the third layer) at least in the interface between the third layer and the first layer (i.e., on the lower face of the third layer). Further, the third layer contains the QD phosphor particles 150 m (first nanoparticles in the third layer) at least in the interface between the third layer and the second layer (i.e., on the upper face of the third layer).

By providing the third layer, the QD phosphor particles 150 m can suitably fill the first voids. In addition, the nanoparticles 170 m can suitably come into contact with the nanoparticles 170 contained in the second layer. In addition, within the third layer, voids formed among the plurality of nanoparticles 170 m can be suitably filled with the QD phosphor particles 150 m.

Thus, according to the element 1, by providing the third layer, the contact properties for the first nanoparticle network and the second nanoparticle network can be improved compared to the element 1r. Thus, carriers can be moved more efficiently in the element 1. As a result, a sufficiently high luminous efficiency can be achieved. As described above, according to the first embodiment, an element with superior performance (light-emitting element) can be provided compared with before.

Film Thickness of Mixed Layer 16

A film thickness (thickness) of the first layer is d1, a film thickness of the second layer is d2, and a film thickness of the third layer is d3. The larger value between d1 and d2 is referred to as dm. That is, dm=Max (d1, d2).

The inventors have newly found the knowledge that "d3 is preferably two times greater than Dm (D2 in the first embodiment) and smaller than dm." That is, the inventors have newly found that d3 preferably satisfies the relationship of the following expression (1), that is, $$2 \times Dm < d3 < dm \quad (1).$$

Specifically, the inventors have newly found the problem that "When d3 is too small (e.g. when d3≤2× Dm is satisfied), the contact area between the nanoparticles 170 m and the nanoparticles 170 contained in the second layer decreases near the interface between the second layer and the third layer of the element 1. That is, the contact properties between the first nanoparticle network and the second nanoparticle network cannot be effectively improved. As a result, luminous efficiency of the element 1 decreases." Based on this point, the inventors have set a lower limit of the preferred numerical range of d3 to 2×Dm.

Furthermore, the inventors have newly found the problem that "When d3 is too large (d3≥dm), electrical resistance of the third layer increases. As a result, luminous efficiency of the element 1 may decrease." The inventors have set a lower limit of the preferred numerical range of d3 to dm. As described above, the expression (1) is a preferred numerical range of d3 newly found by the inventors.

Larger Particle-Sized Nanoparticles in Third Layer and Smaller Particle-Sized Nanoparticles in Third Layer in Mixed Layer 16

The inventors have further found a suitable ratio between the QD phosphor particles 150 $m$ (first nanoparticles in the third layer) and nanoparticles 170 $m$ (second nanoparticles in the third layer) in the element 1 (in a case of D1<D2). Specifically, the inventors have found that, in the mixed layer 16, a preferable ratio between the nanoparticles 170 $m$ (nanoparticles having a larger particle size) and the QD phosphor particles 150 $m$ (nanoparticles having a smaller particle size) is QD phosphor particles 150 $m$:nanoparticles 170 $m$=1:3 to 3:1 in terms of volume ratio.

Here, with respect to the first nanoparticles in the third layer and the second nanoparticles in the third layer contained in the mixed layer 16, a proportion (volume %) of nanoparticles having a larger particle size (more specifically, the central value of particle size distribution) (which will be referred to as larger particle-sized nanoparticles in the third layer) is set to NN1. In the case of the element 1, the nanoparticles 170 $m$ are the larger particle-sized nanoparticles in the third layer.

In addition, with respect to the first nanoparticles in the third layer and the second nanoparticles in the third layer contained in the mixed layer 16, a proportion (volume %) of nanoparticles having a smaller particle size (more specifically, the central value of particle size distribution) (which will be referred to as smaller particle-sized nanoparticles in the third layer) is set to NN2. In the case of the element 1, the QD phosphor particles 150 $m$ are the smaller particle-sized nanoparticles in the third layer.

A relationship between the ratios described above can be expressed by the following expression (2):

$$\frac{1}{3} \leq NN1/NN2 \leq 3 \quad (2).$$

As described above, the inventors have found that a preferable ratio of the larger particle-sized nanoparticles in the third layer to the smaller particle-sized nanoparticles in the third layer is ⅓ or higher and 3 or lower in terms of volume ratio.

The inventors have found a new problem that "If the number of larger particle-sized nanoparticles in the third layer is significantly different from the number of smaller particle-sized nanoparticles in the third layer, it is difficult to form a network of fewer nanoparticles (one of the first nanoparticle network and the second nanoparticle network) in the third layer. As a result, the luminous efficiency of the element 1 can decrease."

Based on the above point, the inventors have set a suitable numerical range of the ratio of the larger particle-sized nanoparticles in the third layer to the smaller particle-sized nanoparticles in the third layer as in the expression (2). Note that the relationship of the expression (2) is satisfied in a case of D1>D2 (the second embodiment to be described below).

In addition, the inventors have found that it is more preferable for the following expression (3), that is, the relationship of $$\frac{1}{2} \leq NN1/NN2 \leq 2 \quad (3),$$

to be satisfied. When the expression (3) is satisfied, the contact properties between the first nanoparticle network and the second nanoparticle network is further improved. Note that the relationship of the expression (3) is satisfied in the case of D1>D2 (the second embodiment to be described below).

Modified Example

The QD layer 15 may be used as a light absorption layer that absorbs light of a predetermined wavelength band and generates an electrical signal (e.g., voltage or current). That is, the element 1 may be used as a light receiving element. In this case, the QD layer 15 functions as a light absorption layer having excellent energy conversion efficiency (power generation efficiency). The electronic device 100 may be, for example, a solar cell. Alternatively, the element 1, which is a light receiving element, can also be used as an imaging element (image sensor). In this case, the electronic device 100 may be an imaging taking apparatus (e.g., a digital camera).

If the element 1 is used as a light receiving element, a band gap of the QD phosphor particles 150 may be set such that EL does not emit visible light. For example, a band gap of the QD phosphor particles 150 may be set such that EL or photo-luminescence (PL) emits invisible light (e.g., ultraviolet or infrared light).

Modified Example

A band gap of the nanoparticles 170 is preferably larger than a bandgap of the QD phosphor particles 150. By setting the band gap of the nanoparticle 170 in this manner, light emitted by the QD phosphor particles 150 can be prevented from being absorbed by the nanoparticles 170. Furthermore, a band gap of the nanoparticles 170 is preferably 3.1 eV or greater. By setting a band gap of the nanoparticles 170 in this manner, light extraction efficiency across the entire visible light band is improved. Consequently, visible light use efficiency of the element 1 can increased. For example, because visible light emitted from the element 1 (light-emitting element) can be effectively used, the element 1 can be suitably used as a light source of a display device and a illumination device.

Second Embodiment

Figure 3:
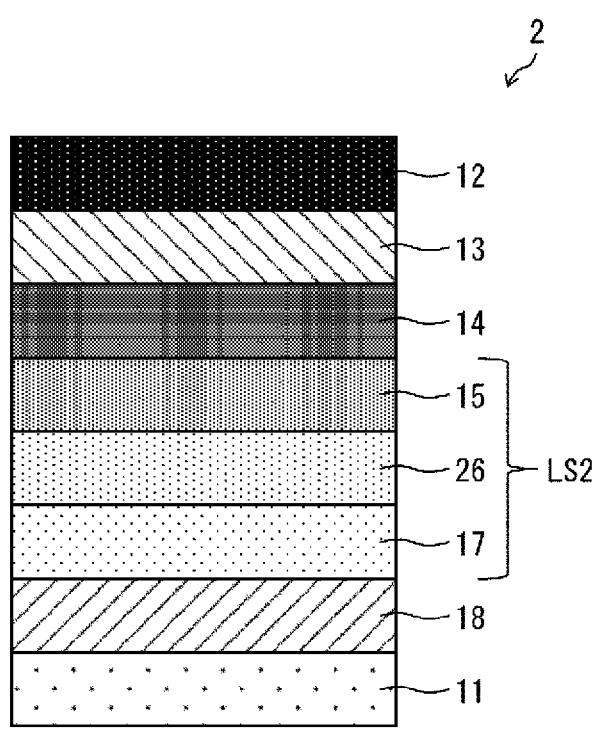
FIG. 3 is a diagram illustrating a schematic configuration of an element according to a second embodiment.

FIG. 3 illustrates a schematic configuration of an element 2 of the second embodiment. In the element 2, members excluding a substrate 11 are stacked in the reverse order to that in the element 1. The element 2 includes a substrate 11, a second electrode 18, an electron transportation layer 17 (first layer), a mixed layer 26 (third layer), a QD layer 15 (second layer), a hole transportation layer 14, a hole injection layer 13, and a first electrode 12 in this order from the bottom to the top.

In the second embodiment, a structure constituted by the QD layer 15, the mixed layer 26, and the electron transportation layer 17 will be referred to as a layered structure LS2.

In the layered structure LS2, the vertical relationship of the members is reversed from the layered structure LS. Accordingly, in the second embodiment, the electron transportation layer 17 is a first layer and the QD layer 15 is a second layer.

Thus, in the second embodiment, nanoparticles 170 are first nanoparticles and QD phosphor particles 150 are second nanoparticles. Also in the second embodiment, a particle size of the nanoparticles 170 is assumed to be greater than a particle size of the QD phosphor particles 150 as in the first embodiment. Thus, in the second embodiment, D1>D2 is satisfied. Thus, Dm=D1 is satisfied.

Comparative Example: Element 2r

Figure 4:
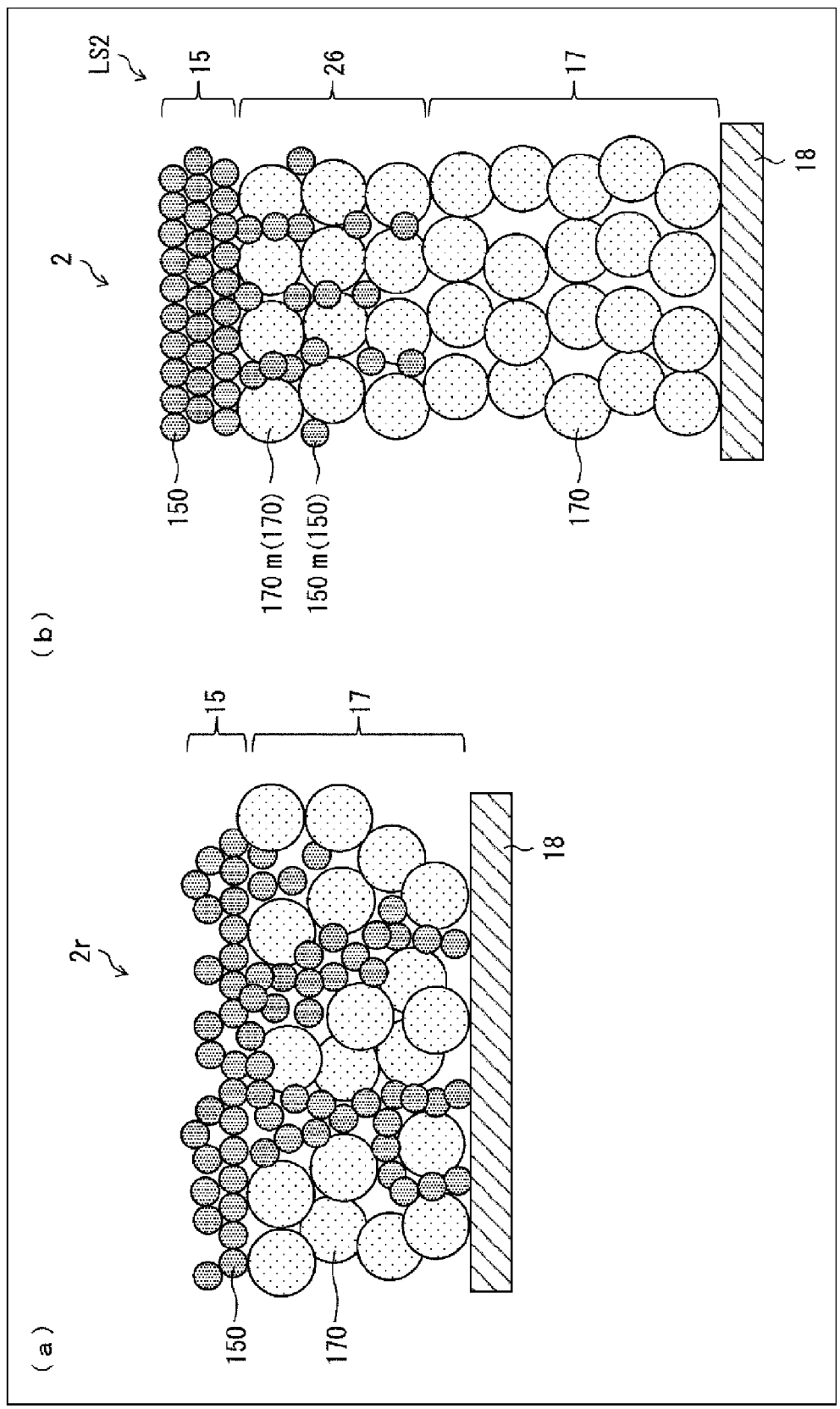
FIGS. 4(a) and 4(b) are diagrams each for describing the role of a mixed layer in the second embodiment.

FIG. 4 is a diagram for describing a role of the mixed layer 26 (third layer). The element 2r is illustrated in (a) of FIG. 4 as a comparative example of the element 2. The element 2r has a configuration in which the mixed layer 26 is removed from the element 2. Thus, in the element 2r, the upper face of the electron transportation layer 17 is in contact with the lower face of the QD layer 15.

In addition, the lower face of the electron transportation layer 17 is in contact with the second electrode 18 (electron injection layer) which is a conductive layer. In the second embodiment, voids (first voids) are formed among a plurality of nanoparticles 170 (first nanoparticles) within the electron transportation layer 17 (first layer).

With respect to the configuration of the element 2r, the inventors have newly found the knowledge that "A particle size of the second nanoparticles (QD phosphor particles 150) is smaller than a particle size of the first nanoparticles. Thus, the first layer containing the first nanoparticles is likely to form larger voids (first voids) than with the particle size of the second nanoparticles. Thus, the second nanoparticles easily enter the first voids to be disposed in the first voids."

Then, the inventors have newly found the knowledge that "The first layer has many portions in which the first voids having a larger size than the second nanoparticles penetrate from the second layer side to the electron injection layer. If the second layer is formed on such a first layer, the second nanoparticles enter the first voids to be disposed in the first voids, and some second nanoparticles that have penetrated into the first voids come into contact with the electron injection layer. In other words, a second nanoparticle network is formed in the first layer and the second nanoparticle network comes into contact with the electron injection layer."

Further, the inventors have newly found the knowledge that "Because the second nanoparticle network comes into contact with the electron injection layer, the hole blocking function of the electron transportation layer (first layer) is lost. Thus, in the element 2r, the luminous efficiency decreases. In other words, in the element 2r, sufficiently high luminous efficiency cannot be achieved." The inventors have newly found the above problems with the element 2r.

In addition, the inventors have newly found the knowledge that "(i) The formation of the second nanoparticle network by penetration of the second nanoparticles into the first voids and (ii) the contact of the formed second nanoparticle network with the electron injection layer may develop over time even during an operation of the element. These matters may greatly impair reliability of the element 2r." The inventors also have newly found the above problem with the element 2r.

Role of Mixed Layer 26

Based on the above problems with the element 2r, the inventors have conceived a new configuration in which "The layered structure LS2 is provided in the element 2. In other words, a third layer (e.g., the mixed layer 26) is provided between the first layer and the second layer."

In (b) of FIG. 4, the layered structure LS2 of the element 2 is illustrated. The mixed layer 26 (i) is adjacent to the first layer (electron transportation layer 17) and the second layer (QD layer 15), and (ii) contains the first nanoparticles (nanoparticles 170) and the second nanoparticles (QD phosphor particles 150). As in the first embodiment, the QD phosphor particles 150 contained in the mixed layer 26 are also referred to as QD phosphor particles 150 m (second nanoparticles in the third layer), and the nanoparticles 170 contained in the mixed layer 26 are referred to as nanoparticles 170 m (first nanoparticles in the third layer).

The third layer of the second embodiment functions as a physical barrier (barrier layer) that prevents the second nanoparticles of the second layer from entering the first voids. The third layer contains the QD phosphor particles 150 m (second nanoparticles in the third layer) at least in the interface between the third layer and the first layer (i.e., on the lower face of the third layer). Furthermore, the third layer contains the nanoparticles 170 m (first nanoparticles in the third layer) at least in the interface between the third layer and the second layer (in other words, on the upper face of the third layer). Thus, by providing the third layer (containing the QD phosphor particles 150 m and the nanoparticles 170 m), the second nanoparticles of the second layer are less likely to enter the first layer. As a result, the second nanoparticle network is less likely to be formed in the first layer.

That is, a possibility of the second nanoparticle network coming into contact with the electron injection layer can be reduced. As a result, loss of the hole blocking function of the electron transportation layer (first layer) can be prevented. Thus, in the element 2, the hole blocking function can be effectively exhibited on the electron transportation layer. Thus, a sufficiently high luminous efficiency can be achieved. As described above, the second embodiment can also provide an element with superior performance compared with before.

Film Thickness of Mixed Layer 26

The inventors have newly found from the element 2 that d3 preferably satisfies the expression (1) described above. The basis for setting an upper limit (dm) of the preferred numerical range of d3 is similar to that in the first embodiment.

The inventors have newly found the problem that "Voids are easily generated in the third layer of the element 2 if d3 is too small (e.g. d3≤2×Dm). Thus, the function of the barrier layer of the third layer is impaired. Thus, the second nanoparticles of the second layer tend to enter the first layer. As a result, the luminous efficiency of the element 2 can decrease."

As described above, the inventors have also set a lower limit of the preferred numerical range of d3 to 2×Dm for the element 2. Thus, the expression (1) can be applied to any case of (i) D1<D2 (first embodiment) and (ii) D2>D1 (second embodiment).

Third Embodiment

Figure 5:
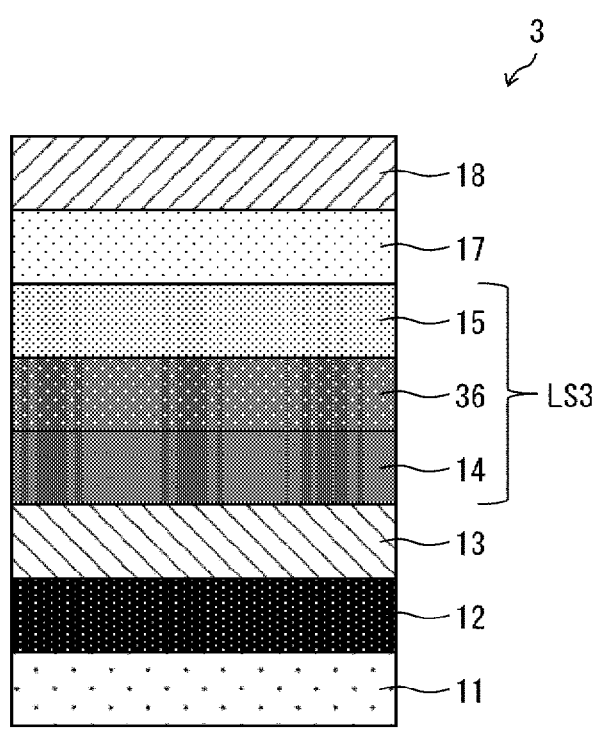
FIG. 5 is a diagram illustrating a schematic configuration of an element according to a third embodiment.

FIG. 5 illustrates a schematic configuration of an element 3 of a third embodiment. The element 3 includes a substrate 11, a first electrode 12, a hole injection layer 13, a hole transportation layer 14 (first layer), a mixed layer 36 (third layer), a QD layer 15 (second layer), an electron transportation layer 17, and a second electrode 18 in this order from the bottom to the top. In other words, in the element 3, the vertical relationship between the mixed layer and the QD layer is reversed from that in the first embodiment.

In the third embodiment, a structure composed of the hole transportation layer 14, the mixed layer 36, and the QD layer 15 will be referred to as a layered structure LS3. In the third embodiment, the hole transportation layer 14 includes a material having excellent hole transport properties as nanoparticles 140 (first nanoparticles) (see FIG. 6). Examples of material of the nanoparticle 140 include NiO, $Cr_2O_3$, $Cu_2O$, CuO, $CuAlO_2$, and the like.

In the third embodiment, the hole transportation layer 14 is a first layer and the QD layer 15 is a second layer. Thus, in the third embodiment, the nanoparticles 140 are first nanoparticles and QD phosphor particles 150 are second nanoparticles. In the third embodiment, a particle size of the nanoparticles 140 is smaller than a particle size of the QD phosphor particles 150. Therefore, in the third embodiment, D1<D2 is satisfied. Therefore, Dm=D2 is satisfied.

However, the particle size of the QD phosphor particles 150 need not necessarily be set to be greater than the particle size of the nanoparticles 140. A particle size of the QD phosphor particles 150 may be set to be smaller than a particle size of the nanoparticles 140 (see a fourth embodiment, which will be described below).

Comparative Example: Element 3r

Figure 6:
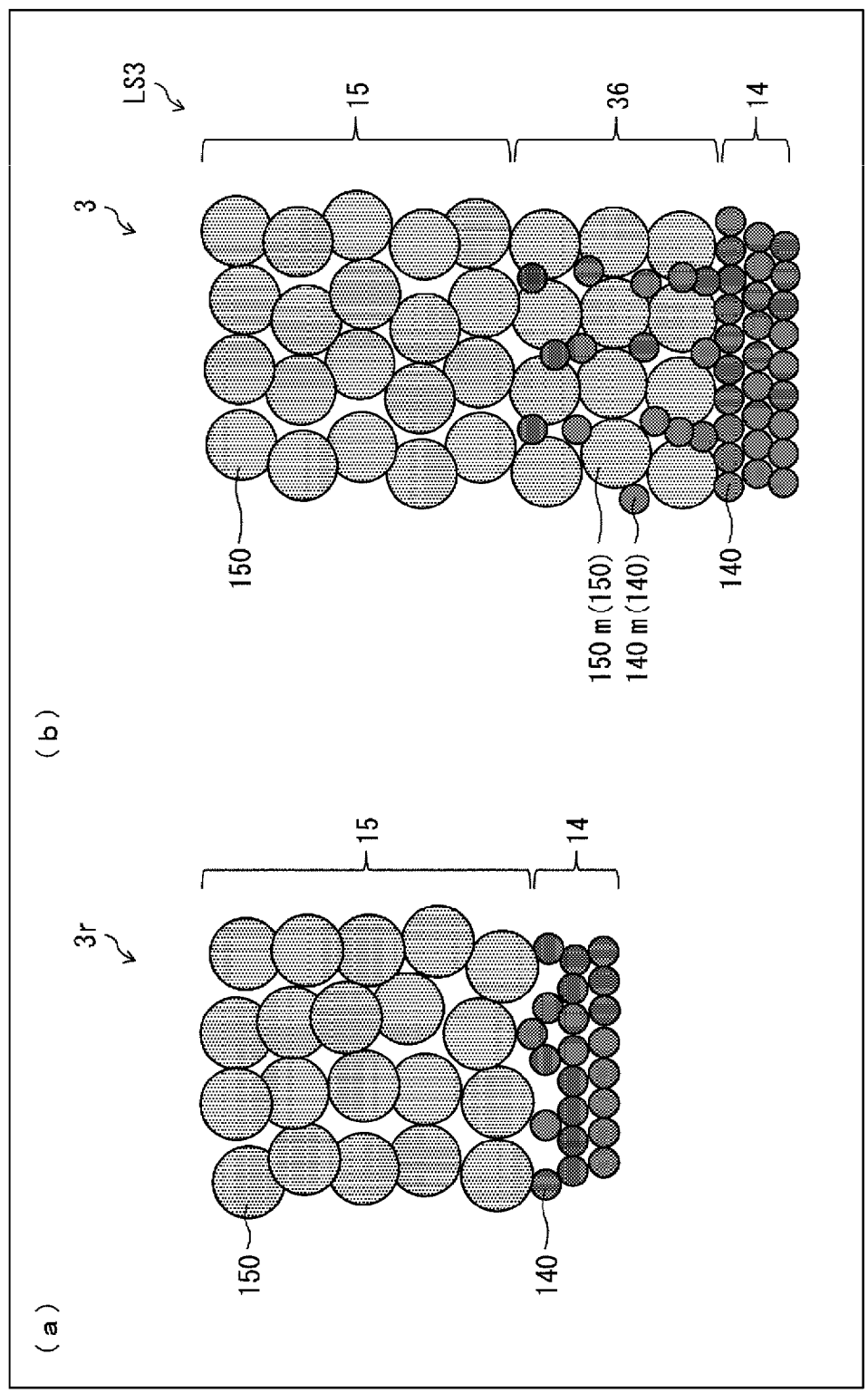
FIGS. 6(a) and 6(b) are diagrams each for describing the role of a mixed layer in the third embodiment.

FIG. 6 is a diagram for describing a role of the mixed layer 36 (third layer). An element 3r is illustrated in (a) of FIG. 6 as a comparative example of the element 3. The element 3r has a configuration in which the mixed layer 36 is removed from the element 3. Thus, in the element 3r, the upper face of the hole transportation layer 14 is in contact with the lower face of the QD layer 15.

The inventors have also confirmed that similar problems as those of the element 1r had occurred in the element 3r. Further, the inventors have confirmed the fact that "The contact properties of the first nanoparticle network and the second nanoparticle network was not good also in the element 3r. For this reason, sufficiently high luminous efficiency was not achieved."

Role of Mixed Layer 36

In (b) of FIG. 6, the layered structure LS3 of the element 3 is illustrated. The mixed layer 36 is adjacent to (i) a first layer (hole transportation layer 14) and a second layer (QD layer 15), and (ii) contains first nanoparticles (nanoparticles 140) and second nanoparticles (QD phosphor particles 150). For convenience of description, the nanoparticles 140 contained in the mixed layer 36 will also be referred to as nanoparticles 140 m (first nanoparticles in the third layer), and the QD phosphor particles 150 contained in the mixed layer 36 will also be referred to as QD phosphor particles 150 m (second nanoparticles in the third layer). In the case of the element 3, the QD phosphor particles 150 m are larger particle-sized nanoparticles in the third layer, and the nanoparticles 140 m are smaller particle-sized nanoparticles in the third layer.

By providing the third layer (nanoparticles 140 m and QD phosphor particles 150 m) also in the element 3, the contact properties between the first nanoparticle network and the second nanoparticle network can be improved compared with in the element 3r. As described above, the third embodiment can also provide an element with superior performance compared with before.

Fourth Embodiment

An element according to an aspect of the disclosure includes a first layer (lower layer), a third layer (mixed layer or intermediate layer), and a second layer (upper layer) from the substrate side toward the top. An example of combination of the lower layer and the upper layer is as in Examples 1 to 8 below.

FIG. 7 is a table showing the configurations of Examples 1 to 8. Hereinafter, a QD layer will be abbreviated as "QDL," an electron transportation layer will be abbreviated as "ETL," and a hole transportation layer will be abbreviated as "HTL." In addition, first nanoparticles (nanoparticles contained in the lower layer) are abbreviated as "NP," and second nanoparticles (nanoparticles contained in the upper layer) are abbreviated as "NP2."

As will be described below, one of the lower layer and the upper layer is QDL. Thus, one of NP1 and NP2 is QD phosphor particles 150. In contrast, the other of the lower layer and the upper layer is ETL or HTL. Thus, the other of NP1 and NP2 is nanoparticles 140 or nanoparticles 170.

Example 1

Lower layer: QDL;
Upper layer: ETL;
D1<D2 (NP1 is smaller in size compared to NP2);
Example 1 corresponds to the configuration described in the first embodiment. According to Example 1, the effect "The contact properties between the first nanoparticle network and the second nanoparticle network can be improved by providing the third layer (hereinafter, Effect A)" is exhibited.

As typical example of Example 1, D1=8 nm, d1=40 nm, D2=16 nm, d2=80 m, and d3=40 nm are set. In FIG. 7, the numerical values in the parentheses indicate preferred numerical ranges. In Example 1, preferably, D1 is 4 to 16 nm, d1 is 8 to 80 nm, D2 is 8 to 60 nm, and d2 is 40 to 160 nm.

In the typical example of Example 1, Dm=D2=16 nm is set, and 2×Dm=32 nm is satisfied. In addition, dm=d2=80 nm is satisfied. Therefore, in the typical example of Example 1, d3 is preferably 32 to 80 nm.

Example 2

Lower layer: ETL;
Upper layer: QDL;
D1>D2 (NP2 is smaller in size compared to NP1);
Example 2 corresponds to the configuration described in the second embodiment. According to Example 2, the effect "The formation of the second nanoparticle network from the second layer (upper layer) to the lower part of the first layer (lower layer) can be prevented by providing the third layer" (hereinafter, Effect B) is exhibited.

In a typical example of Example 2, (i) the values of D1 and D2 are reversed from those of the typical example of Example 1, and (ii) the values of d1 and d2 are reversed from those of the typical example of Example 1. The same applies to each preferred numerical range of D1 to d2.

In the typical example of Example 2, Dm=D1=16 nm is set, and 2×Dm=32 nm is satisfied. In addition, dm=d1=80 nm is satisfied. Thus, in the typical example of Example 2, the values of Dm and dm are equal to those of the typical example of Example 1. Thus, in the typical example of Example 2, the preferred numerical range of d3 is equal to that in the typical example of Example 1.

Example 3

Lower layer: QDL;
Upper layer: ETL;
D1>D2;

In Example 3, the size relationship between NP1 and NP2 is reversed from that of Example 1. In Example 3, the size relationship between a size of NP1 and a size of NP2 is similar to that of Example 2. Therefore, Effect B is exhibited.

In a typical example of Example 3, the values of D1 and d1 are equal to those of Example 1. As the typical example of Example 3, D2=3 nm, d2=80 nm, and d3=30 nm are set. In Example 3, preferably, D2 is 1 to 13 nm and d2 is 40 to 160 nm.

In the typical example of Example 3, Dm=D1=8 nm is set, and thus 2×Dm=16 nm is satisfied. In addition, dm=d2=80 nm is satisfied. Therefore, in the typical example of Example 3, d3 is preferably 16 to 80 nm.

Example 4

Lower layer: ETL;
Upper layer: QDL;
D1<D2;

In Example 4, the size relationship between NP1 and NP2 is reversed from that of Example 2. In Example 4, the size relationship between a size of NP1 and a size of NP2 is similar to that of Example 1. Therefore, Effect A is exhibited.

In a typical example of Example 4, (i) the values of D1 and D2 are reversed from those of the typical example of Example 3, and (ii) the values of d1 and d2 are reversed from those of the typical example of Example 3. The same applies to each preferred numerical range of D1 to d2.

In the typical example of Example 4, Dm=D2=8 nm is set, and thus 2×Dm=16 nm is satisfied. In addition, dm=d1=80 nm is satisfied. Thus, in the typical example of Example 4, the values of Dm and dm are equal to those of the typical example of Example 3. Thus, in the typical example of Example 4, the preferred numerical range of d3 is equal to that of the typical example of Example 3.

Example 5

Lower layer: QDL;
Upper layer: HTL;
D1<D2;

Example 5 is a configuration in which the upper layer of Example 1 is replaced from ETL to HTL. In Example 5, the size relationship between a size of NP1 and a size of NP2 is the same as that of Example 1. Therefore, Effect A is exhibited. In Example 5, the values of D1 to d2 are equal to those of Example 1, respectively. Therefore, in Example 5, the value of d3 is also equal to that of Example 1.

Example 6

Lower layer: HTL;
Upper layer: QDL;
D1>D2;

Example 6 is a configuration in which the lower layer of Example 2 is replaced from ETL to HTL. In Example 6, the size relationship between a size of NP1 and a size of NP2 is the same as that of Example 2. Therefore, Effect B is exhibited. In Example 6, the values of D1 to d2 are equal to those of Example 2, respectively. Therefore, in Example 6, the value of d3 is also equal to that of Example 2.

Example 7

Lower layer: QDL;
Upper layer: HTL;
D1>D2;

In Example 7, the size relationship between NP1 and NP2 is reversed from that of Example 5. In Example 7, the size relationship between a size of NP1 and a size of NP2 is the same as that of Example 2. Therefore, Effect B is exhibited. In Example 7, the values of D1 to d2 are equal to those of Example 3, respectively. Therefore, in Example 7, the value of d3 is also equal to that of Example 3.

Example 8

Lower layer: HTL;
Upper layer: QDL;
D1<D2;

Example 8 corresponds to the configuration described in the third embodiment. In Example 8, the size relationship between a size of NP1 and a size of NP2 is the same as that of Example 1. Therefore, Effect A is exhibited. In Example 8, the values of D1 to d2 are equal to those of Example 4, respectively. Therefore, in Example 8, the value of d3 is also equal to that of Example 4.

Fifth Embodiment

In a manufacturing method of an element according to an aspect of the disclosure, a first layer (lower layer), a third layer (mixed layer or intermediate layer), and a second layer are formed in this order. An example of the manufacturing method will be described below.

First, (i) a first liquid composition (a liquid composition in which first nanoparticles are dispersed in a solvent) that is a material of the first layer, (ii) a second liquid composition (a liquid composition in which second nanoparticles are dispersed in a solvent) that is a material of the second layer, and (iii) a third liquid composition (a liquid composition in which first nanoparticles and second nanoparticles are dispersed in a solvent) that is a material of the third layer are prepared.

Note that, for the solvent of each liquid composition, it is preferable to alternately use a non-polar solvent (hydrophobic solvent) and a polar solvent (hydrophilic solvent) in order of application of the first liquid composition, the third liquid composition, and the second liquid composition. Examples of the non-polar solvent include hexane, octane, toluene, and the like. In addition, examples of the polar solvent include water, methanol, ethanol, isopropyl alcohol (IPA), and the like.

In a case in which a non-polar solvent is used as a solvent for the first liquid composition (referred to as a first solvent below), for example, it is preferable to use (i) a polar solvent for a solvent for the third liquid composition (referred to as a third solvent below) and (ii) a non-polar solvent for a solvent of the second liquid composition (referred to as a second solvent). In contrast, in a case in which a polar solvent is used as the first solvent, it is preferable to use (i) a non-polar solvent for the third solvent and (ii) a polar solvent for the second solvent.

By making the polarity (hydrophilicity) of the third solvent different from the first solvent and the second solvent as described above, composition mixture between the third layer and the first layer or the second layer can be prevented. For example, it is possible to prevent the first nanoparticles and the second nanoparticles contained in the third layer (e.g., in a case of the element 1, the QD phosphor particles 150 $m$ and the nanoparticles 170 $m$ contained in the mixed layer 16) from mixing with (i) the first nanoparticles contained in the first layer (e.g., the QD phosphor particles 150 contained in the QD layer 15) and (ii) the second nanoparticles contained in the second layer (e.g., the nanoparticles 170 contained in the electron transportation layer 17).

Next, the first layer is formed. First, the first liquid composition (liquid composition containing the first nanoparticles) is applied to the upper face of a predetermined layer that has already been formed (e.g., in the case of the element 1, the hole transportation layer 14) to form a coating film of the first liquid composition. Then, as the first solvent is volatilized (e.g., the coating film is caused to be naturally dried), the coating film is solidified (hardened). As a result, the first layer can be formed.

Then, the third liquid composition (liquid composition containing the first nanoparticles and the second nanoparticles) is applied to the upper face of the formed first layer to form a coating film of the third liquid composition. Then, the third layer is formed by volatilizing the third solvent.

Next, the second liquid composition (liquid composition containing the second nanoparticles) is applied to the upper face of the formed third layer to form a coating film of the second liquid composition. Then, by volatilizing the second solvent, the second layer is formed. As described above, an element having the first layer, the third layer, and the second layer in this order from the bottom can be obtained.

Examples of Ligands Suitable for Nanoparticles

It is preferable for the first liquid composition to further contain a ligand having the first nanoparticles as a receptor (first ligand) to appropriately disperse the first nanoparticles in a solvent. The first ligand also serves to protect the surface of the first nanoparticles. When a first liquid composition containing the first nanoparticles and the first ligand is used, a first layer in which the surface of the first nanoparticles is protected by the first ligand can be obtained. As a result, the chemical or physical stability of the first layer is improved.

Likewise, it is preferable for the second liquid composition to further contain a ligand having the second nanoparticles as a receptor (second ligand) to appropriately disperse the second nanoparticles in a solvent. The second ligand also serves to protect the surface of the second nanoparticles. When a second liquid composition containing the second nanoparticles and the second ligand is used, a second layer in which the surface of the second nanoparticles is protected by the second ligand can be obtained. As a result, the chemical or physical stability of the second layer is improved.

It is preferable for the third liquid composition to further contain a ligand having the first nanoparticles as a receptor (third ligand) to appropriately disperse the first nanoparticles in a solvent. The third ligand also serves to protect the surface of the first nanoparticle. When the third liquid composition containing the first nanoparticles and the third ligand is used, a third layer in which the surface of the first nanoparticles is protected by the third ligand can be obtained. As a result, the chemical or physical stability of the third layer is improved.

Likewise, it is preferable for the third liquid composition to further contain a ligand having the second nanoparticles as a receptor (fourth ligand) to appropriately disperse the second nanoparticles in a solvent. The fourth ligand also serves to protect the surface of the second nanoparticles. When the third liquid composition containing the second nanoparticles and the fourth ligand is used, a third layer in which the surface of the second nanoparticles is protected by the fourth ligand can be obtained. As a result, the chemical or physical stability of the third layer is improved.

FIG. 8 is a table showing examples of ligands suitable for materials of the nanoparticles of each layer (QDL, HTL, and ETL). Each layer in FIG. 8 is a lower layer (first layer) or an upper layer (second layer). Thus, nanoparticles of each layer in FIG. 8 is first nanoparticles or second nanoparticles. Description of materials for the nanoparticles of each layer in FIG. 8 has already been provided, and thus will not be repeated.

"R" in FIG. 8 denotes a hydrophobic group. That is, a ligand may contain a hydrophobic group. Examples of the hydrophobic group include alkyl groups ($C_nH_{2n+1}$) and alkenyl groups ($C_nH_{2n-1}$). Note that n is preferably approximately 8 to 18. The hydrophobic group is preferably a straight-chain hydrocarbon group. That is, the ligand preferably contains a linear hydrocarbon group.

Case in which Nanoparticles are Dispersed in Non-Polar Solvent

Types of the ligand when nanoparticles of QDL (e.g., QD phosphor particles 150) are dispersed in a non-polar solvent are, for example, a thiol (R—SH), an amine (R—NH$_2$), and an organic phosphorus compound, and the like. For example, dodecanethiol is used as thiol. Examples of amine include, for example, oleylamine, dodecylamine, hexadecylamine, and the like. Examples of organic phosphorus compounds include, for example, trioctyl phosphine and trioctyl phosphine oxide.

Types of the ligand when nanoparticles of the HTL (e.g. nanoparticles 140) and nanoparticles of the ETL (e.g., nanoparticles 170) are dispersed in a non-polar solvent are, for example, a carboxylic acid (R—COOH) an amine, and the like. For example, palmitic acid and oleic acid are used as the carboxylic acid. For example, hexadecylamine and oleylamine are used as the amine.

Case in which Nanoparticles are Dispersed in Polar Solvent Types of the ligand when nanoparticles of the QDL are dispersed in a polar solvent are, for example, $A_1$-$R_1$-$B_1$ ($R_1$: an atomic group including a hydrocarbon, $A_1$: a functional group coordinated with a nanoparticle, and $B_1$: a functional group having a polarity). Examples of $R_1$ include (i) an alkylene group ($C_nH_{2n}$), and (ii) an unsaturated hydrocarbon group ($C_nH_{2n-2}$) with one hydrogen removed from an alkenyl group. Note that n is preferably 8 or greater and 18 or smaller. In this case, high luminous efficiency is achieved. Furthermore, the atomic group preferably contains a straight-chain hydrocarbon group. That is, the ligand preferably contains a linear hydrocarbon. In this case, high luminous efficiency is achieved. Examples of $A_1$ include an amino group (—NH$_2$), a mercapto group (—SH), and the like. In addition, examples of $B_1$ include a hydroxyl group (—OH), a carboxyl group (—COOH), an amino group, and the like.

Specific examples of ligand include 12-amino-1-dodecanethiol, 12-aminododecanoic acid, 12-mercaptododecanoic acid, and the like. In addition, "$R_1$" may include polyethylene glycol. In this case, dispersibility in the polar solvent is favorable.

In contrast, types of the ligand when nanoparticles of the HTL and nanoparticles of the ETL are dispersed in a polar solvent are, for example, $A_2$-$R_2$-$B_2$ ($R_2$: an atomic group containing a hydrocarbon, $A_2$: a functional group coordinated with a nanoparticle, and $B_2$: a functional group having a polarity). Examples of $R_2$ include (i) an alkylene group ($C_kH_{2k}$), and (ii) an unsaturated hydrocarbon group ($C_kH_{2k-2}$) with one hydrogen removed from an alkenyl group. Note that k is preferably 1 or greater and 7 or smaller. In this case, carrier conduction between the nanoparticles is good. The atomic group preferably contains a straight-chain hydrocarbon group. That is, the ligand preferably contains a linear hydrocarbon group. Specific examples of the ligand include ethanolamine, 3-aminopropanoic acid, glycolic acid, and the like. Examples of $A_2$ include a carboxyl group, an amino group, and the like. Examples of $B_2$ include a hydroxyl group, a carboxyl group, an amino group, and the like, similarly to $B_1$ described above.

Note that, if the nanoparticles of the HTL and the nanoparticles of the ETL are composed of inorganic oxides, no ligand may be needed. The reason for this is that nanoparticles made of inorganic oxides have high affinity with polar solvents.

Further, the more uniform the distribution of the first nanoparticles and the second nanoparticles in the third layer becomes, the more preferably the aforementioned Effects A and B can be exhibited. That is, it is preferable for the distribution of the first nanoparticles and the second nanoparticles in the third layer to be substantially uniform.

When the third solvent is a polar solvent, $B_1$ and $B_2$ (functional groups having a polarity) are preferably the same functional group. In this case, it is possible to prevent the same type of nanoparticles from being ubiquitous in the third layer. Thus, uniformity of the distribution of the first nanoparticles and the second nanoparticles in the third layer is improved, and Effects A and B are more favorably exhibited.

Furthermore, $R_1$ and $R_2$ (atomic groups containing hydrocarbons) are preferably the same atomic group. In this case, it is possible to further prevent the same type of nanoparticles from being ubiquitous in the third layer. Thus, uniformity of the distribution of the first nanoparticles and the second nanoparticles in the third layer is further improved, and Effects A and B are even more effectively exhibited.

Also, when the third solvent is a non-polar solvent, the hydrophobic groups in the ligands coordinated with the first nanoparticles and the hydrophobic groups in the ligands coordinated with the second nanoparticles are preferably the same. In this case, it is possible to prevent the same type of nanoparticles from being ubiquitous in the third layer, and thus Effects A and B are favorably exhibited.

Supplement

An element according to a first aspect includes a first layer containing first nanoparticles, a second layer containing second nanoparticles of a different type from the first nanoparticles, and a third layer sandwiched between the first layer and the second layer to be adjacent to the first layer and the second layer, in which one of the first nanoparticles and the second nanoparticles is quantum dot phosphor particles, and the third layer contains the first nanoparticles and the second nanoparticles.

The element according to a second aspect further includes a substrate configured to support the first layer, the second layer, and the third layer, in which the first layer is disposed at a position closer to the substrate than the second layer is, a central value of particle size distribution of the first nanoparticles contained in the first layer is set as a first central value, a central value of particle size distribution of the second nanoparticles contained in the second layer is set as a second central value, and the first central value is smaller than the second central value.

The element according to a third aspect further includes a substrate configured to support the first layer, the second layer, and the third layer, in which the first layer is disposed at a position closer to the substrate than the second layer is, a central value of particle size distribution of the first nanoparticles contained in the first layer is set as a first central value, a central value of the particle size distribution of the second nanoparticles contained in the second layer is set as a second central value, and the first central value is greater than the second central value.

In the element according to a fourth aspect, the third layer contains second nanoparticles at least in the interface between the third layer and the first layer and the first nanoparticles at least in the interface between the third layer and the second layer.

In the element according to a fifth aspect, a greater central value of the first central value and the second central value is set as Dm, a greater film thickness between a film thickness of the first layer and a film thickness of the second layer is set as dm, and a film thickness of the third layer is two times greater than Dm and smaller than dm.

In the element according to a sixth aspect, of the first nanoparticles and the second nanoparticles contained in the third layer, nanoparticles having a greater central value of particle size distribution are set as larger particle-sized nanoparticles in the third layer, and nanoparticles having a smaller central value of the particle size distribution is set as smaller particle-sized nanoparticles in the third layer, and a ratio of the larger particle-sized nanoparticles in the third layer to the smaller particle-sized nanoparticles in the third layer is ⅓ or higher and 3 or lower in terms of volume ratio.

In the element according to a seventh aspect, a ratio of the larger particle-sized nanoparticles in the third layer to the smaller particle-sized nanoparticles in the third layer is ½ or higher and 2 or lower in terms of volume ratio.

An electronic device according to an eighth aspect includes an element according to an aspect of the disclosure.

A method for manufacturing an element according to a ninth aspect is a method for manufacturing an element according to an aspect of the disclosure, the method including forming the first layer using a first liquid composition containing the first nanoparticles, forming the third layer using a third liquid composition containing the first nanoparticles and the second nanoparticles after forming of the first layer, and forming the second layer using a second liquid composition containing the second nanoparticles after forming of the third layer.

In the method for manufacturing an element according to a tenth aspect, a solvent for the first liquid composition is set as a first solvent, a solvent for the second liquid composition is set as a second solvent, a solvent for the third liquid composition is set as a third solvent, the first solvent and the second solvent are non-polar solvents, and the third solvent is a polar solvent.

In the method for manufacturing an element according to an eleventh aspect, a solvent for the first liquid composition is set as a first solvent, a solvent for the second liquid composition is set as a second solvent, a solvent for the third liquid composition is set as a third solvent, the first solvent and the second solvent are polar solvents, and the third solvent is a non-polar solvent.

In the method for manufacturing an element according to a twelfth aspect, the first liquid composition further contains a first ligand having the first nanoparticle as a receptor.

In the method for manufacturing an element according to a thirteenth aspect, the second liquid composition further contains a second ligand having the second nanoparticle as a receptor.

Additional Items

One aspect of the disclosure is not limited to each of the embodiments stated above, and various modifications are possible within the scope indicated in the claims, and embodiments obtained by appropriately combining technical means stated in each of the different embodiments also fall within the technical scope of one aspect of the disclosure. Moreover, novel technical features can be formed by combining the technical approaches disclosed in each of the embodiments.

The invention claimed is:

1. An element comprising:
a first layer containing first nanoparticles;
a second layer containing second nanoparticles that are nanoparticles of a different type from the first nanoparticles; and
a third layer sandwiched between the first layer and the second layer to be adjacent to the first layer and the second layer,
wherein one of the first nanoparticles and the second nanoparticles is quantum dot phosphor particles, and
the third layer contains the first nanoparticles and the second nanoparticles,
wherein the element further comprises:
a substrate configured to support the first layer, the second layer, and the third layer,
wherein the first layer is disposed at a position closer to the substrate than the second layer is,
a central value of particle size distribution of the first nanoparticles contained in the first layer is set as a first central value,
a central value of particle size distribution of the second nanoparticles contained in the second layer is set as a second central value, and
wherein a greater central value of the first central value and the second central value is set as Dm,
a greater thickness of a thickness of the first layer and a thickness of the second layer is set as dm, and
a thickness of the third layer is two times greater than Dm and smaller than dm.

2. The element according to claim 1,
wherein the first central value is smaller than the second central value.

3. The element according to claim 1,
wherein the first central value is greater than the second central value.

4. The element according to claim 1,
wherein the third layer contains the second nanoparticles at least in an interface between the third layer and the first layer and the first nanoparticles at least in an interface between the third layer and the second layer.

5. The element according to claim 1,
wherein, of the first nanoparticles and the second nanoparticles contained in the third layer, nanoparticles having a greater central value of particle size distribution are set as larger particle-sized nanoparticles in the third layer, and nanoparticles having a smaller central value of the particle size distribution are set as smaller particle-sized nanoparticles in the third layer, and a ratio of the larger particle-sized nanoparticles in the third layer to the smaller particle-sized nanoparticles in the third layer is ⅓ or higher and 3 or lower in terms of volume ratio.

6. The element according to claim 5,
wherein the ratio of the larger particle-sized nanoparticles in the third layer to the smaller particle-sized nanoparticles in the third layer is ½ or higher and 2 or lower in terms of volume ratio.

7. An electronic device comprising:
the element according to claim 1.

8. A method for manufacturing the element according to claim 1, the method comprising:
forming the first layer using a first liquid composition containing the first nanoparticles;
forming the third layer using a third liquid composition containing the first nanoparticles and the second nanoparticles after forming of the first layer; and
forming the second layer using a second liquid composition containing the second nanoparticles after forming of the third layer.

9. The method for manufacturing the element according to claim 8,
wherein a solvent for the first liquid composition is set as a first solvent,
a solvent for the second liquid composition is set as a second solvent,
a solvent for the third liquid composition is set as a third solvent,
the first solvent and the second solvent are non-polar solvents, and
the third solvent is a polar solvent.

10. The method for manufacturing the element according to claim 8,
wherein a solvent for the first liquid composition is set as a first solvent,
a solvent for the second liquid composition is set as a second solvent,
a solvent for the third liquid composition is set as a third solvent,
the first solvent and the second solvent are polar solvents, and
the third solvent is a non-polar solvent.

11. The method for manufacturing the element according to claim 8,
wherein the first liquid composition further contains a first ligand having the first nanoparticle as a receptor.

12. An element comprising:
a first layer containing first nanoparticles;
a second layer containing second nanoparticles greater than the first nanoparticles;
wherein either the first layer or the second layer is a light-emitting layer,
a penetration portion mixed the first nanoparticles and the second nanoparticles between the first layer and the second layer, having voids formed by the second nanoparticles, the first nanoparticles filling at least a part of the voids,
wherein a central value of particle size distribution of the second nanoparticles is set as Dm,
a greater thickness of a thickness of the first layer and a thickness of the second layer is set as dm,
a penetration distance of the first nanoparticles penetrating into the voids formed by the second nanoparticles in the penetration portion is larger than twice Dm and smaller than dm.

13. A light-emitting element comprising:
the element according to claim 12.

14. A light receiving element comprising:
the element according to claim 12.

15. A solar cell comprising:
the light receiving element according to claim 14.

16. An imaging taking apparatus comprising:
the light receiving element according to claim 14.

17. An element comprising:
a first layer containing first nanoparticles;
a second layer containing second nanoparticles that are nanoparticles of a different type from the first nanoparticles; and
a third layer sandwiched between the first layer and the second layer to be adjacent to the first layer and the second layer,
wherein one of the first nanoparticles and the second nanoparticles is quantum dot phosphor particles, and
the third layer contains the first nanoparticles and the second nanoparticles,
wherein, of the first nanoparticles and the second nanoparticles contained in the third layer, nanoparticles having a greater central value of particle size distribution are set as larger particle-sized nanoparticles in the third layer, and nanoparticles having a smaller central value of the particle size distribution are set as smaller particle-sized nanoparticles in the third layer,
wherein a ratio of the larger particle-sized nanoparticles in the third layer to the smaller particle-sized nanoparticles in the third layer is ⅓ or higher and 3 or lower in terms of volume ratio.

18. The element according to claim 17, further comprising:
a substrate configured to support the first layer, the second layer, and the third layer,
wherein the first layer is disposed at a position closer to the substrate than the second layer is,
a central value of particle size distribution of the first nanoparticles contained in the first layer is set as a first central value,
a central value of particle size distribution of the second nanoparticles contained in the second layer is set as a second central value, and
the first central value is smaller than the second central value.

19. The element according to claim 17, further comprising:
a substrate configured to support the first layer, the second layer, and the third layer,
wherein the first layer is disposed at a position closer to the substrate than the second layer is,
a central value of particle size distribution of the first nanoparticles contained in the first layer is set as a first central value,
a central value of particle size distribution of the second nanoparticles contained in the second layer is set as a second central value, and
the first central value is greater than the second central value.

20. The element according to claim 17,
wherein the ratio of the larger particle-sized nanoparticles in the third layer to the smaller particle-sized nanoparticles in the third layer is ½ or higher and 2 or lower in terms of volume ratio.

* * * * *